United States Patent
Schweitzer, III

(10) Patent No.: US 6,774,785 B2
(45) Date of Patent: Aug. 10, 2004

(54) FRONT PANEL LIGHT SYSTEM FOR AN ELECTRONIC INSTRUMENT WHICH INDICATES THE OPERATING CONDITION OF THE FRONT PANEL LIGHTS AND SELECTED PORTIONS OF THE INSTRUMENT

(75) Inventor: Edmund O. Schweitzer, III, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 124 days.

(21) Appl. No.: 10/150,577

(22) Filed: May 17, 2002

(65) Prior Publication Data

US 2003/0214414 A1 Nov. 20, 2003

(51) Int. Cl.[7] .............................................. G08B 29/00
(52) U.S. Cl. ........................ 340/516; 340/458; 340/641; 340/642
(58) Field of Search .................................. 340/458, 459, 340/461, 462, 647, 657, 664, 984, 514, 516, 520, 641, 642, 643; 361/93.2, 80; 315/291, 307, 316; 324/73.1, 551, 557

(56) References Cited

U.S. PATENT DOCUMENTS

| | | | | |
|---|---|---|---|---|
| 5,115,226 A | * | 5/1992 | Schweitzer, III | 340/664 |
| 5,224,011 A | * | 6/1993 | Yalla et al. | 361/93.2 |
| 6,046,550 A | * | 4/2000 | Ference et al. | 315/291 |
| 6,054,865 A | * | 4/2000 | Bald et al. | 340/647 |
| 6,469,641 B1 | * | 10/2002 | Lash et al. | 340/984 |

* cited by examiner

Primary Examiner—Van T. Trieu
(74) Attorney, Agent, or Firm—Cook, Alex, McFarron, Menzo, Cummings & Mehler, Ltd.

(57) ABSTRACT

The system tests front panel lights, such as LEDs, on an electronic instrument, the front panel lights being normally used to indicate the status of selected output conditions of the instrument. The system also uses the LEDs to communicate additional information concerning the instrument, in particular the operation of the clock system for the instrument. The system includes a plurality of timers, each timer being associated with one front panel LED. The user sets the timers a specific amount of time (e.g. one second) apart, with each LED being programmed with a different timer. The LEDs light in succession in response to the clock reaching a preselected time. If one or more of the LEDs do not light, failure of the LEDs is indicated. If the LEDs do not light in proper order or at the expected time, investigation of the clock system is indicated.

23 Claims, 3 Drawing Sheets

FRONT PANEL LIGHT SYSTEM FOR AN ELECTRONIC INSTRUMENT WHICH INDICATES THE OPERATING CONDITION OF THE FRONT PANEL LIGHTS AND SELECTED PORTIONS OF THE INSTRUMENT

TECHNICAL FIELD

This invention relates generally to electrical instruments using LEDs or similar light elements to indicate the operating condition or status of selected functional portions of the instrument, such as whether a particular function of the instrument has been enabled and/or a result determined relating to that function. More particularly, the invention concerns a system for indicating the operating condition of the LEDs and in addition using the LEDs to provide information about the operating condition of portions of the system other than the functional portions normally associated therewith.

BACKGROUND OF THE INVENTION

In many electrical instruments, such as for example protective relays used for protection of electric power systems, a plurality of lights, frequently LEDs (light emitting diodes), are used on the front panel of the relay to indicate particular fault conditions detected by the relay. A protective relay typically will carry out a number of protection functions, and the LEDs when lit indicate that the particular protection function associated with the individual LEDs has determined that a fault condition exists. Alternatively, the LEDs can be used to indicate when a particular protection function has been enabled within the relay, as opposed to indicating a result of a protection function.

For instance, a particular relay in one functional configuration might be capable of detecting one or more of a plurality of possible fault conditions involving power line current, voltage and frequency values which are out of normal tolerance. When the voltage or current values obtained from the power line are processed and a fault condition determined, output contacts in the relay are energized, which results in a signal applied to a circuit breaker controlling the associated portion of the line on which the fault has occurred. The LED on the front panel associated with the particular fault condition typically is then illuminated, indicating that the relay has in fact made a particular fault determination.

Users of such equipment are often concerned as to whether or not the light elements themselves are operational; a test push button or other device is frequently used to confirm that the individual lights are in fact operating, i.e. properly connected and not burned out. In one arrangement to accomplish such an objective, appropriate commands or test conditions which mimic fault determinations are provided to the relay, typically by a test set, or from a separate PC (personal computer) or similar device.

However, in some situations, it is inconvenient or otherwise undesirable to have a separate test button on the instrument and/or to use a separate test set for the LEDs. In such cases, it would be desirable to have an LED test system which does not use a separate test circuit or apparatus. Also, it would be desirable to increase the functionality of the LED front panel lights, i.e. the LEDs or other light elements could be used to provide information concerning the operation/function of other aspects of the instrument, in addition to their normal function indications.

SUMMARY OF THE INVENTION

Accordingly, the present invention includes a system for testing front panel lights on an electronic instrument, the lights being used to indicate the status of selected operational functions of the electronic instrument, comprising: a clock signal available in the apparatus; at least one timer settable to assert when the clock signal reaches a selected time; and means for programming selected front panel lights to illuminate in response to the timer asserting, wherein a failure of one or more lights to illuminate indicates a failure of the lights.

The invention also includes a system for using front panel lights on an electronic instrument, which are normally used to indicate the status of selected operational functions of the instrument, to also indicate the operating state of other aspects of the instrument, comprising: a clock signal available in the apparatus; at least one timer settable to assert when the clock signal reaches a selected time; and means for programming a plurality of selected front panel lights to illuminate in response to the at least one timer asserting, wherein there is a recognizable difference in the illumination of the front panel lights when there is an error in the clock signal.

BEST MODE FOR CARRYING OUT THE INVENTION

Figure 1:
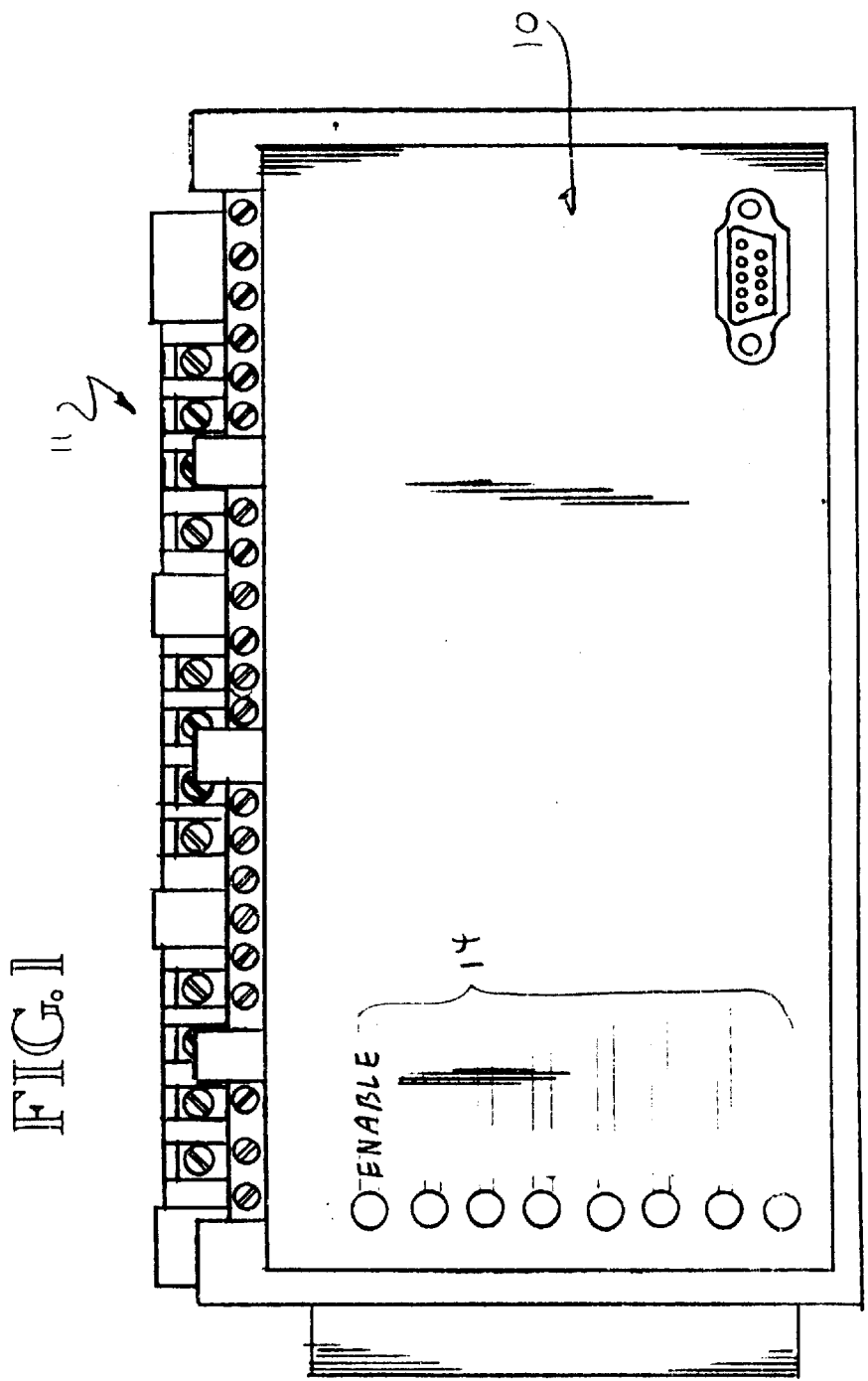
FIG. 1 is a pictorial view of a front panel of a electric power relay which includes illustrative target lights indicating operation of various portions of the relay.

Referring to FIG. 1, a front panel 10 of a microprocessor-based relay 11 used in monitoring power systems is shown. The front panel 10 shows a total of eight target lights 14—14. The uppermost target light in FIG. 1 when illuminated indicates that the relay is enabled, while illumination of the other lights indicates, respectively, that a particular fault condition(s) have been determined to exist on the power line by the processing circuitry of the relay.

Such fault conditions could include under-voltage and over-voltage conditions, or other fault conditions involving voltage, current and frequency values. It should be emphasized that the particular fault determinations associated with the front panel lights will vary from instrument to instrument. The present invention is not limited to a particular set of protective functions and further is not limited to electric power relays. Other processing devices which are designed to recognize selected functional conditions, including but not limited to fault conditions, and which illuminate lights on the instrument front panel as an indication that such conditions have been recognized, can make use of the present invention.

The target lights 14—14 in the embodiment shown are LEDs (light emitting diodes), although it should be understood that other types of lights can be used. LEDs, however, are currently very popular for instrumentation, since they have a long lifetime and rarely fail.

As explained above, existing test elements for LEDs either have a push button switch on the front panel which tests the operation of the LEDs, or the device includes or accommodates a test set, the output signals of which can be used to directly test the LEDs.

The system of the present invention, however, not only tests the LEDs, but the resulting pattern/order of illumination thereof produced by the system provides information concerning the operational condition of selected other portions of the relay not related to the fault determinations or other functions normally associated with the LEDs.

More particularly, the LED test system of the present invention makes use of the clock signal normally present in the relay apparatus or in another embodiment, a separate clock signal, to test the LEDs. The system is also arranged, however, to produce a pattern of LED lighting with the clock signal which indicates the proper operation of the clock, as well as proper operation of the CPU (central processing unit) and/or the TPU (timing processing unit) relative to their countdown function.

Figure 2:
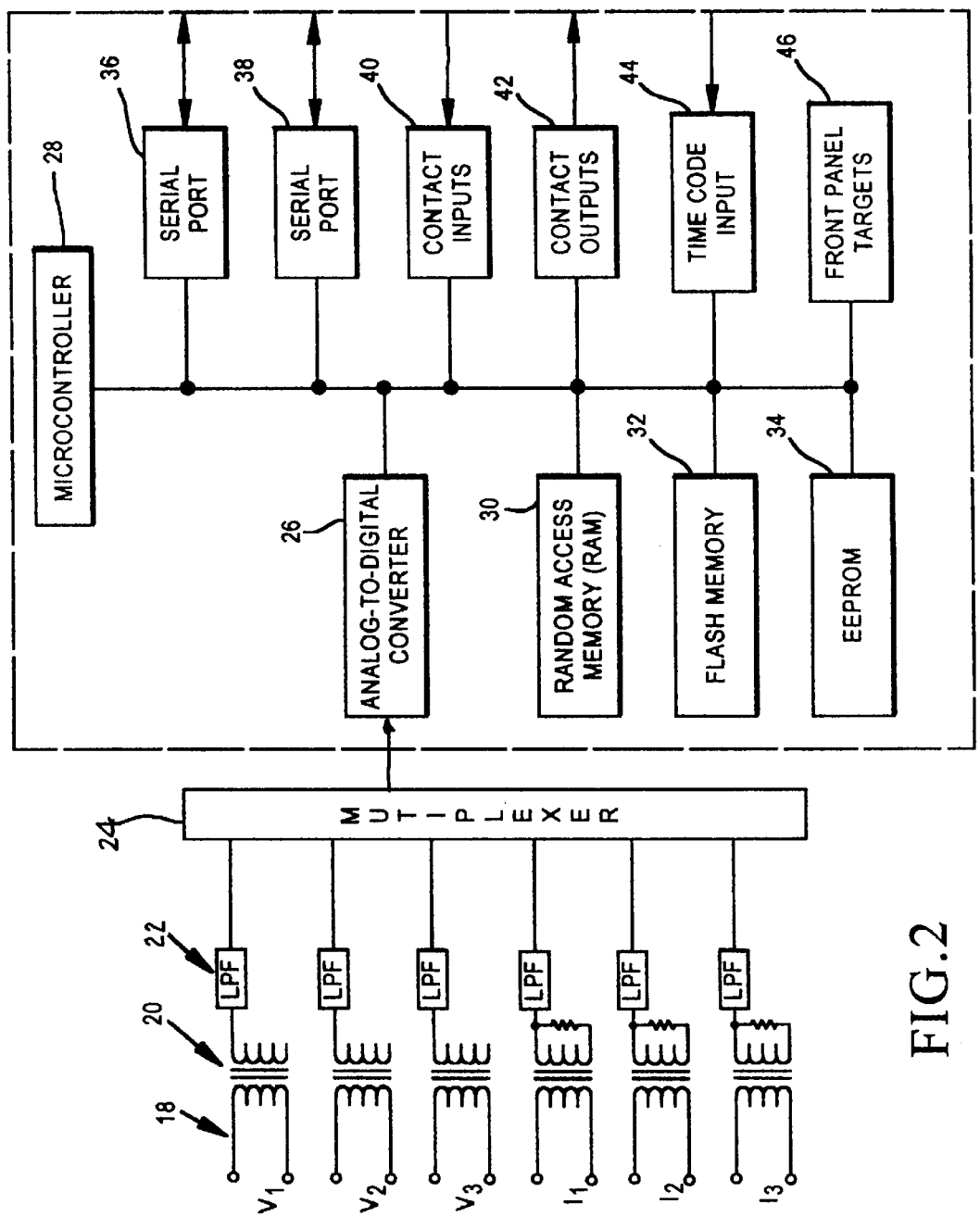
FIG. 2 is a simplified block diagram of a conventional microprocessor-based electronic relay for protection of power systems.

FIG. 2 shows a basic block diagram of a power system protective relay in which the LED/light system of the prevent invention can be used, for instance, a distributed generator interconnection relay available from Schweitzer Engineering Laboratories in Pullman, Wash., the assignee of the present invention.

In the protective relay, the three phase voltages $V_1$, $V_2$ and $V_3$ and the three phase currents $I_1$, $I_2$ and $I_3$ are analog signals acquired from the power line, reduced in magnitude by conventional voltage and current transformers. These voltages and currents 18—18 are then further reduced by relay input transformers 20—20 to levels appropriate for electronic processing. The resulting voltage and current signals are then applied to low-pass filters 22—22 and then to a multiplexer 24, which will sample the output of the low-pass filters. The sampled, multiplexed data is then applied to an A-D converter 26 for processing. The relay includes microprocessor/controller 28 as well as RAM memory 30, flash memory 32 and EEPROM 34.

The relay further includes two serial ports 36 and 38 and contact input and outputs 40 and 42. The relay also includes a time code input connection 44 and also the front panel targets 46, i.e. the LED front panel lights. The time code input, the internal clock and the target lights are the focus of this application. The relay shown and described is for example only, for purposes of explanation of the invention. The invention can be used in other protective relays as well as other electronic instruments.

Figure 3:
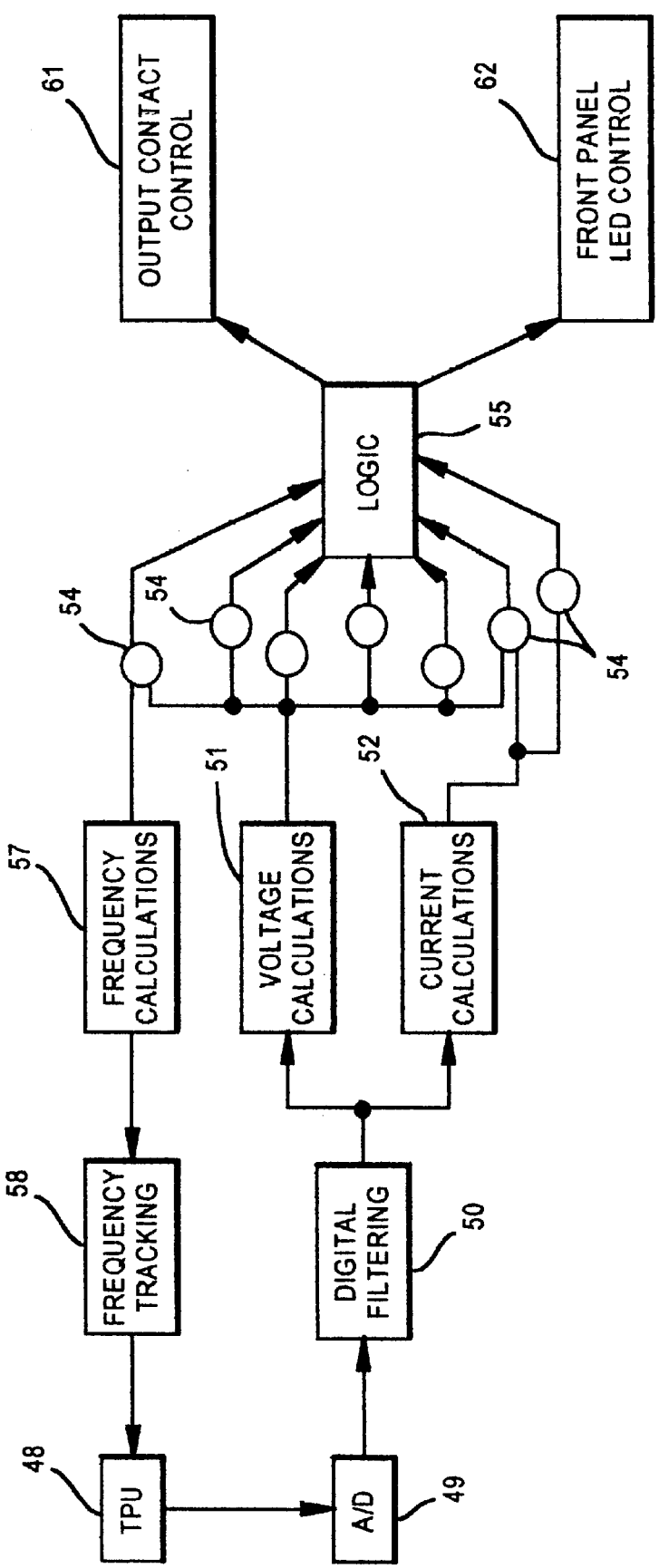
FIG. 3 is a diagram of one portion of the circuit of FIG. 2.

FIG. 3 is a functional flow diagram of the basic operation of the relay of FIG. 2. TPU (timing processing unit) 48 controls the operation of A/D converter 50. The output of the A/D converter 49 is filtered digitally at 50 and voltage and current calculations are performed on the results at 51 and 52.

A number of protection functions are carried out by the relay microprocessor 26, as indicated by the circles 54—54 in FIG. 3, with the use of logic equations, shown generally at block 55. Frequency calculations are carried out at block 57 in the relay, and applied to a frequency tracking circuit 58, which in turn is connected to TPU 48. The results of the logic equations are used to control output contacts 61 and front panel target lights (LEDs) 62 associated, respectively, with the output functions 54—54.

In a first embodiment of the present invention, relay 12 is responsive to an external time code at input 44 (FIG. 2). The external time code can be supplied by a number of different sources. With an external time code input, the relay sets bits to indicate when the internal time clock (not shown) of the apparatus reaches a preselected value, referred to as an absolute value. The absolute time can be set in hours, minutes and seconds (or even micro-seconds if desired), identified as HH:MM:SS. Typically, there will be the same number of timer bits settable by the user as the number of front panel lights. The user can set the individual timers successively at a selected time interval, such as one second. It is also possible to use a single timer to illuminate all of the LEDs in sequence at selected intervals.

Each front panel LED is then programmed with the output of a different timer. The front panel LEDs will then illuminate in succession with the particular time interval, e.g. one second. The successive illumination of the LEDs will indicate to an observer the operability of each of the LEDs. In one example, the LEDs will blink on for ½₀th of a second, with each successive LED being illuminated one second apart. This occurs continuously. Operability of all of the LEDs thus can be determined at a glance. If one or more LEDs do not light, those LEDs can be replaced.

Also, however, the illumination of the LEDs provide information on the operation of the clock and/or its communication with the external time code source. If the LEDs 14—14 do not illuminate at the time expected or in order expected, and the LEDs are operable, then the user will know to investigate the clock circuitry further, e.g. the time code source may not be functioning properly or out of tolerance.

In a variation of the absolute time information embodiment discussed above, the system can be programmed on a periodic time basis. Using either the internal clock by itself, with no external time code source input, or the internal clock updated from an external time code source, the relay will set a timer bit to assert for one processing interval at successive times set by the user via the programmable logic 55 (FIG. 3). If a particular timer, e.g. timer 1, was set for a particular time (hour, minutes/second), the output of that timer would assert and illuminate its associated LED for one processing interval at the specified time. If the timer, for instance, was set for P01:00:00 (P stands for periodic), the output of the timer would assert for one processing interval every hour. Other periodic time sets would result in a different illumination pattern. One advantage to the periodic arrangement is that the LED illumination is pre-programmed to have a pattern which is set by the user.

In the periodic time embodiment as well, the LEDs will light in a particular sequence for selected times at successive intervals, the interval amount being selected by the user. If they do not, one or more of the LEDs may be bad and hence need to be replaced. Further, if the sequence and timing of the LED illumination is out of order or irregular, investigation of the clock and the source is appropriate.

In both embodiments, where an external time code source is used to update a plurality of instruments and the LEDs in those instruments do not blink in concert, synchronization of the internal clock in the instrument with the external source may have been lost. Investigation is warranted.

Aside from the clock information, date information can also be provided via the front panel LEDs. The range of settings will include every day of the week. Lastly, combinations of date and times can be provided.

The illumination of the front panel lights from the time clock signals thus provides important information concerning the operation of the LEDs and the clock circuitry. First, the enable LED on the front panel (if there is one) will usually be illuminated. If the instrument itself is not enabled, the enable LED will not light and the remainder of the LEDs will not illuminate as anticipated. The lack of illumination of the enable LED indicates that either the internal clock or the external time code source has failed, or that the CPU which counts down the time clock to the required number has failed. The user will know to investigate further if the enable LED does not light as anticipated.

If the enable LED does light, but the other LEDs do not illuminate either at the times expected or in the order expected or if one or more LEDs do not illuminate at all, various fault conditions are possible, including the failure of one or more of the LEDs, a frequency drift of the internal clock if the clock is independent of the external time code source, or a drift/malfunction in the calculating circuitry of the micro-controller. Also, if the front panel lights for multiple instruments using the same time code external source do not blink together a condition of lost synchronism between one or more instruments and the source is indicated.

While the above embodiments have used a clock which is also used for processing the data applied to the relay for making fault determinations, it should be understood that the clock signal for the LED test may be separate and independent of the clock signal used for processing.

Hence, a system has been disclosed by which the front panel target lights on a relay or other electronic device are tested using the internal time clock. The pattern of illumination of the LEDs furthermore provides information concerning the operating state of the time clock system in the relay.

Although a preferred embodiment of the invention has been disclosed herein for purposes of illustration, it should be understood that various changes, modifications and substitutions may be incorporated without departing from the spirit of the invention, which is defined by the claims which follow.

What is claimed is:

1. A system for testing front panel lights on an electronic instrument, wherein the lights are used to indicate the status of selected operational functions of the electronic instrument, comprising:
    a clock signal;
    at least one timer settable to assert when the clock signal reaches a selected time; and
    means for programming selected front panel lights to illuminate in response to the at least one timer asserting, wherein a failure of one or more lights to illuminate indicates a failure of said lights.

2. A system of claim 1, wherein the clock signal is used by the instrument in its processing functions.

3. A system of claim 2, wherein the clock signal is produced by a countdown circuit operating from a clock signal source.

4. A system of claim 3, wherein the clock signal source is internal to the instrument.

5. A system of claim 3, wherein the clock signal source is an external time code.

6. A system of claim 1, wherein the clock signal is produced internally of the instrument.

7. A system of claim 1, wherein the clock signal is produced externally of the apparatus.

8. A system of claim 1, wherein the instrument is an electronic relay used for monitoring power systems.

9. A system of claim 1, wherein the timer is settable for hours, minutes and seconds.

10. A system of claim 1, including a plurality of timers, each timer being used to program a separate light on the basis of successive settings.

11. A system of claim 1, wherein the front panel lights are LEDs (light emitting diodes).

12. A system of claim 11, wherein the timers are set a relatively short time apart so that the front panel lights are illuminated in a rapid sequence.

13. A system for using front panel lights on an electronic instrument, which are normally used to indicate the status of selected operational functions, to also indicate the operating state of other aspects of the devices, comprising:
    a clock signal used by the electronic instrument in its processing functions;
    at least one timer settable to assert when the clock signal reaches a selected time; and
    means for programming selected front panel lights to illuminate in response to the at least one timer asserting, wherein there is a recognizable difference in the illumination of the front panel lights when there is an error in the clock signal.

14. A system of claim 13, wherein the clock signal is controlled by a clock signal source.

15. A system of claim 14, wherein the clock signal source is internal to the instrument.

16. A system of claim 14, wherein the clock signal source is an external time code.

17. A system of claim 13, wherein the instrument is an electronic relay used for monitoring power systems.

18. A system of claim 13, wherein the timers are settable for hours, minutes and seconds.

19. A system of claim 13, including a plurality of timers, each timer being used to program a separate light on the basis of successive clock settings to produce successive illumination of all of the lights.

20. A system of claim 19, wherein the front panel lights are LEDs (light emitting diodes).

21. A system of claim 19, wherein the timers are set a relatively short time apart so that the front panel lights are illuminated in a rapid sequence.

22. A system of claim 13, wherein the timers are set to a preselected periodic time.

23. A system of claim 13, wherein the timers are set to an absolute time.

* * * * *